United States Patent
Kim et al.

(10) Patent No.: US 8,358,554 B2
(45) Date of Patent: Jan. 22, 2013

(54) SEMICONDUCTOR MEMORY DEVICE PERFORMING PARTIAL SELF REFRESH AND MEMORY SYSTEM INCLUDING SAME

(75) Inventors: Hyung-jik Kim, Seongnam-si (KR); Han-gu Sohn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 348 days.

(21) Appl. No.: 12/829,448

(22) Filed: Jul. 2, 2010

(65) Prior Publication Data
US 2011/0161578 A1    Jun. 30, 2011

(30) Foreign Application Priority Data
Dec. 24, 2009    (KR) .................. 10-2009-0131201

(51) Int. Cl.
*G11C 7/00*    (2006.01)
(52) U.S. Cl. .................. 365/222; 365/149; 365/189.07
(58) Field of Classification Search .................. 365/222, 365/149, 189.07
See application file for complete search history.

(56) References Cited

U.S. PATENT DOCUMENTS
2004/0027901 A1*    2/2004    Shiga et al. .................. 365/222

FOREIGN PATENT DOCUMENTS
| JP | 2007280608 A | 10/2007 |
| JP | 2008090904 A | 4/2008 |
| JP | 2009059412 A | 3/2009 |

* cited by examiner

*Primary Examiner* — Huan Hoang
(74) *Attorney, Agent, or Firm* — Volentine & Whitt, PLLC

(57) ABSTRACT

A semiconductor memory device capable of performing a partial self refresh and semiconductor memory system including same is provided. The semiconductor memory device includes: a memory circuit including a memory array; a skip address storage unit storing an address of an excluded region not requiring refresh in the memory array as a skip address; a refresh address generator providing an address of a region of the memory array requiring refresh as a refresh address; and an address comparator receiving and comparing the skip address and refresh address, and providing a refresh control signal to the memory circuit based on the comparison.

14 Claims, 7 Drawing Sheets

FIG. 7A
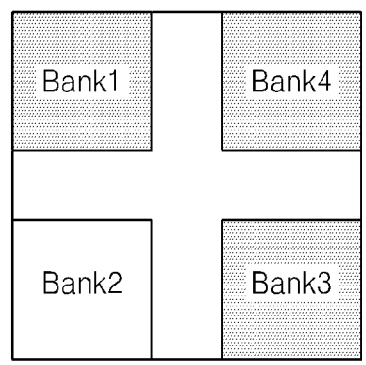
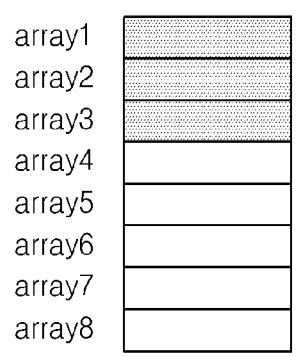
FIG. 7B
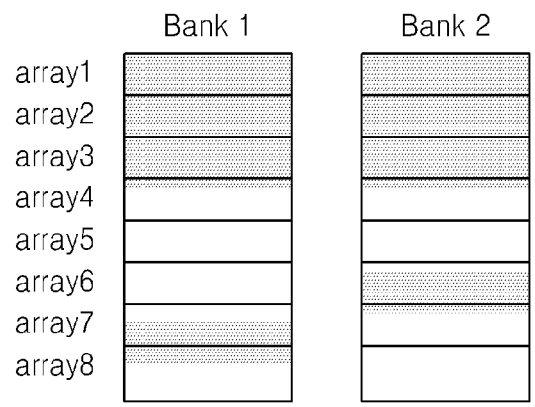

SEMICONDUCTOR MEMORY DEVICE PERFORMING PARTIAL SELF REFRESH AND MEMORY SYSTEM INCLUDING SAME

CROSS-REFERENCE TO RELATED APPLICATIONS

This application claims the benefit of Korean Patent Application No. 10-2009-0131201 filed on Dec. 24, 2009, the subject matter of which is hereby incorporated by reference.

BACKGROUND

The inventive concept relates to semiconductor memory devices capable of performing a partial self refresh, and semiconductor memory systems including this type of memory device. More particularly, the inventive concept relates to semiconductor memory devices not performing (or "excluding") self refresh for a specific region identified by an address while performing self refresh for other regions, as well as memory systems including same.

Data is stored in memory cells of many volatile semiconductor memory devices, such as dynamic random access memory (DRAM), by storing a corresponding level of electrical charge on a capacitor. This charge must be periodically restored (or "refreshed") to avoid the loss of data, since the stored charge inevitably leaks from the capacitor over time.

Accordingly, some form of refresh operation must be used in conjunction with volatile semiconductor memory devices and constituent memory systems.

SUMMARY

Embodiments of the inventive concept provide semiconductor memory devices excluding self refresh in a specific region defined by an address, while performing self refresh in other regions. Embodiments of the inventive concept also provide semiconductor memory systems including this type of semiconductor memory device.

According to an aspect of the inventive concept, there is provided a semiconductor memory device including: a memory circuit including a memory array; a skip address storage unit storing an address of an excluded region not requiring refresh in the memory array as a skip address; a refresh address generator providing an address of a region of the memory array requiring refresh as a refresh address; and an address comparator receiving and comparing the skip address and refresh address, and providing a refresh control signal to the memory circuit based on a result of the comparison.

The memory circuit may receive the refresh control signal and the refresh address and refresh the region of the memory array corresponding to the refresh address in response to activation of the refresh control signal.

The memory circuit may further include a row decoder, a column decoder, and a sense amplifier and receive an external command signal, address signal, and data signal.

The skip address storage unit may receive a command signal and an address signal and store the address signal as a skip address if the command signal is a mode register write signal.

The skip address storage unit may receive an external command signal and an address signal and store the first and last addresses of an excluded region in the memory array of the memory circuit as a skip address if the command signal is a mode register write signal.

Meanwhile, the refresh address generator may include a refresh address counter that receives an external command signal, and sequentially increases the refresh address signal and outputs the refresh address if the command signal is a self refresh-start command signal.

The address comparator may deactivate the refresh control signal if the refresh address corresponds to the excluded region in the memory array based on the comparison between the skip address and the refresh address or activate the refresh control signal if the refresh address corresponds to the region requiring self refresh in the memory array based on the comparison between the skip address and the refresh address.

In addition, the skip address storage unit may receive an external command signal and address signal, store the first address of an excluded region in the memory array and an address subsequent to the last address of the excluded region of the memory array as a skip address if the command signal is a mode register write signal. The address comparator may compare the skip address with the refresh address and toggle the refresh control signal if the skip address is identical to the refresh address.

The semiconductor memory device may further include a self refresh controller that receives a command signal and an address signal, and outputs the address signal to the skip address storage unit if the command signal is a mode register write signal, and activates a refresh enable signal and outputs the activated refresh enable signal to the refresh address generator if the command signal is a self refresh-start command signal, wherein the skip address storage unit stores the address signal that is received from the self refresh controller as a skip address, and wherein the refresh address generator outputs an address of a region in the memory array to be refreshed as the refresh address in response to the activation of the refresh enable signal received from the self refresh controller.

According to another aspect of the inventive concept, there is provided a semiconductor memory system including: a semiconductor memory device; and a memory controller providing a command signal, an address signal, and a data signal to the semiconductor memory device to control the semiconductor memory device, wherein the semiconductor memory device includes: a memory circuit including a memory array; a skip address storage unit storing an address of an excluded region in the memory array as a skip address; a refresh address generator providing an address of a region of the memory array to be refreshed as a refresh address; and an address comparator receiving and comparing the skip address and refresh address, and providing a refresh control signal to the memory circuit based on a result of the comparison.

If an excluded region is defined in the semiconductor memory device, the memory controller may output the mode register write command signal as the command signal and the address of the excluded region as the address signal.

In addition, the memory controller may output the self refresh-start command signal as the command signal to the semiconductor memory device if the semiconductor memory device needs to be self-refreshed. The refresh address generator may output the refresh address in response to the self refresh-start command signal.

The semiconductor memory system may further include an imaging processor providing temporary data related to the encoding or decoding of an image signal to the memory controller, wherein the memory controller provides a mode register write command signal as the command signal and the address of a region of the memory array in which the temporary data is stored as the address signal when the temporary data is input from the imaging processor.

The imaging processor may be a H.264 processor or a digital signal processor.

The semiconductor memory system may further include a microprocessor requesting that the memory controller read data from or write data to the semiconductor memory device, wherein the microprocessor generates a skip signal based on whether or not the self refresh of data input to the memory controller is required, and provides the skip signal to the memory controller, wherein the memory controller provides the mode register write command signal as the command signal and the address of a region in the memory array in which data received from the microprocessor is stored as the address signal in response to activation of the skip signal.

According to another aspect of the inventive concept, there is provided a method of performing self refresh of a semiconductor memory device, the method including: storing an address of an excluded region not requiring refresh in a memory array as a skip address; providing an address of a region in a memory array to be refreshed as a refresh address; comparing the skip address with a refresh address and providing a refresh control signal based on a result of the comparison; and refreshing the region of the memory array corresponding to the refresh address in response to activation of the refresh control signal.

The method may further include receiving a command signal and address signal, wherein the storing of the address of a excluded region as the skip address includes storing the address signal as the skip address if the command signal is a mode register write signal, and the providing of the address of the region to be refreshed as the refresh address includes activating a refresh enable signal if the command signal is a self refresh-start command signal; and providing the refresh address in response to the activation of the refresh enable signal.

BRIEF DESCRIPTION OF THE DRAWINGS

Embodiments of the inventive concept will be more clearly understood from the following detailed description taken in conjunction with the accompanying drawings in which:

FIG. 7A shows a conventional partial self refresh operation;

FIG. 7B shows a partial self refresh operation according to an embodiment of the inventive concept;

DETAILED DESCRIPTION OF THE EMBODIMENTS

The attached drawings illustrate certain exemplary embodiments of the inventive concept and may be referred to in order to gain a sufficient understanding of the inventive concept, the merits thereof, and the objectives accomplished by the implementation of the related embodiments. Throughout the written description and drawings, like reference numbers and labels are used to denote like or similar elements.

Figure 1:
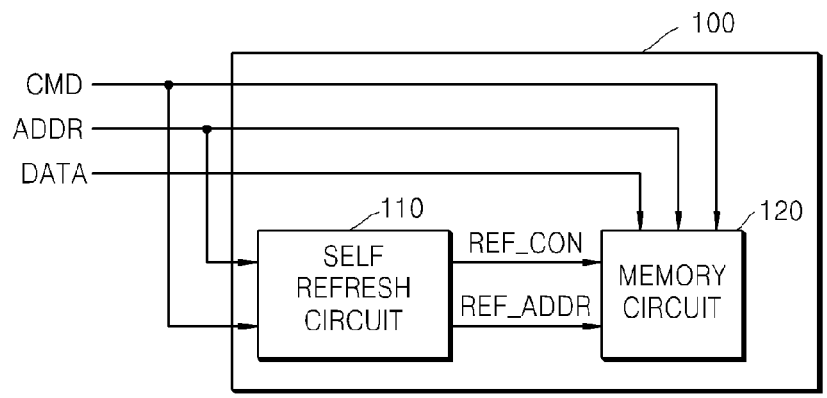
FIG. 1 is a block diagram of a semiconductor memory device according to an embodiment of the inventive concept.

FIG. 1 is a block diagram of a semiconductor memory device 100 according to an embodiment of the inventive concept. Referring to FIG. 1, the semiconductor memory device 100 generally comprises a self refresh circuit 110 and a memory circuit 120. In this regard, the memory circuit 120 may be a dynamic random access memory (DRAM).

The term "self refresh" denotes a refresh operation performed internal to the semiconductor memory device during a predetermined period of time in order to maintain data stored in a memory cell capacitor. This predetermined time period typically occurs while the semiconductor memory device is in an idle or waiting state. During a self refresh operation, all input signals except for an external control signal are deactivated, and a refresh address signal for performing the self refresh operation and a refresh command signal may be generated in the semiconductor memory device 100. Self refresh may be performed in a low power mode, a battery back-up mode, or the like.

The self refresh circuit 110 of FIG. 1 receives a command signal CMD and an address signal ADDR, generates a refresh control signal REF_CON and a refresh address REF_ADDR according to the command signal CMD and the address signal ADDR, and outputs the refresh control signal REF_CON and the refresh address REF_ADDR. The memory circuit 120 may perform a self refresh operation according to the refresh control signal REF_CON and the refresh address REF_ADDR, which are received from the self refresh circuit 110.

Referring to FIG. 1, in the self refresh circuit 110 according to the present embodiment, the refresh unit is not a bank or array. A partial self refresh operation may be performed for each address of the memory circuit 120. The configuration and operation of the self refresh circuit 110 will be described in more detail with reference to FIGS. 2 and 3.

The memory circuit 120 of FIG. 1 receives the refresh control signal REF_CON and the refresh address REF_ADDR from the self refresh circuit 110 and refreshes a memory region corresponding to the refresh address REF_ADDR in response to the activation of the refresh control signal REF_CON.

That is, if the refresh control signal REF_CON that is received from the self refresh circuit 110 is activated, the memory circuit 120 ignores the command signal CMD, the address signal ADDR, and a data signal DATA, and activates a word line that is designated as the refresh address REF_ADDR that is received from the self refresh circuit 110 to perform a refresh operation of the memory circuit 120. The refresh operation of the memory circuit 120 performed by activating the word line is well known by those of ordinary skill in the art, and therefore detailed descriptions thereof will be omitted here.

On the other hand, if the refresh control signal REF_CON that is received from the self refresh circuit 110 is deactivated, the memory circuit 120 does not perform the refresh operation, but performs read and write operations according to the command signal CMD, the address signal ADDR, and the data signal DATA. The read and write operations of the memory circuit 120 are well known by those of ordinary skill in the art, and therefore detailed descriptions thereof will be omitted here.

The memory circuit 120 is any memory circuit that is used in a semiconductor memory device and may include a memory array (not shown) including memory cells, a row decoder (not shown), a column decoder (not shown), and a sense amplifier (not shown). The memory array, the row decoder, the column decoder, and the sense amplifier are commonly used in a memory circuit, and the configuration and operation thereof are well known by those of ordinary skill in the art, and therefore detailed descriptions thereof will be omitted here.

Figure 2:
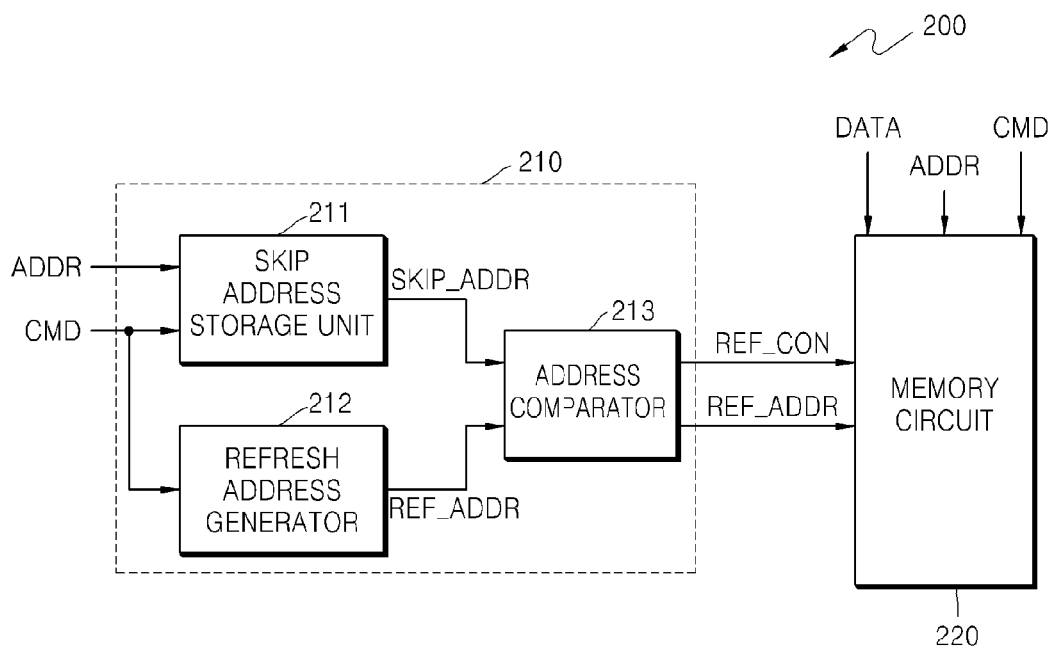
FIG. 2 is a block diagram of a semiconductor memory device according to another embodiment of the inventive concept.

FIG. 2 is a block diagram of a semiconductor memory device 200 according to an embodiment of the inventive concept. Referring to FIG. 2, the semiconductor memory device 200 comprises a self refresh circuit 210 and a memory circuit 220. The memory circuit 220 may have a similar configuration and operation to the memory circuit 120 of FIG. 1. The self refresh circuit 210 of FIG. 2 may be an example of the self refresh circuit 110 of FIG. 1.

As shown in FIG. 2, the self refresh circuit 210 may include a skip address storage unit 211, a refresh address generator 212, and an address comparator 213.

Referring to FIG. 2, the skip address storage unit 211 may store an address of an excluded region in the memory array (not shown) of the memory circuit 220 as a skip address SKIP_ADDR. The skip address storage unit 211 receives an external command signal CMD and address signal ADDR. If the external command signal CMD is a mode register write signal, the skip address storage unit 211 stores the received address signal ADDR as a skip address. The command signal CMD and address signal ADDR may be output from a memory controller that is disposed external to the semiconductor memory device 200. The skip address SKIP_ADDR may be a row address of the memory array.

The skip address storage unit 211 may store the first and last addresses of the excluded region among the memory array (not shown) of the memory circuit 220 as a skip address SKIP_ADDR. That is, the skip address storage unit 211 according to the illustrated embodiment of FIG. 2 does not store all addresses belonging to the "excluded region" not requiring self refresh, but only the first and last addresses of the excluded region to reduce the amount of the skip address SKIP_ADDR stored in the skip address storage unit 211. Accordingly, the storage capacity of the skip address storage unit 211 may be relatively low.

Meanwhile, according to another embodiment, the skip address storage unit 211 may store the first address of the excluded region and an address subsequent to the last address of the excluded region, i.e., the first address of a subsequent region requiring self refresh as a skip address SKIP_ADDR.

The skip address storage unit 211 may output the stored skip address SKIP_ADDR to the address comparator 213.

Referring to FIG. 2, the refresh address generator 212 receives an external command signal CMD. If the received command signal CMD is a self refresh-start command signal, the refresh address generator 212 generates the refresh address REF_ADDR and outputs the refresh address REF_ADDR to the address comparator 213. In this regard, the self refresh-start command signal may be input as a command signal CMD when self refresh of the memory circuit 220 is required.

The refresh address REF_ADDR is an address of a memory array to be refreshed and may be a row address of the memory array. Meanwhile, the refresh address generator 212 may output the refresh address REF_ADDR directly to the memory circuit 220 in addition to the address comparator 213.

The refresh address generator 212 may include a refresh address counter (not shown). The refresh address counter may sequentially increase the refresh address REF_ADDR according to a refresh timing signal and output the refresh address REF_ADDR. For example, if the self refresh-start command signal is input to the refresh address generator 212, the refresh address counter (not shown) may output a first refresh address in a first cycle of the refresh timing signal and a subsequent address of the first refresh address as a second refresh address in a second cycle of the refreshing timing signal. In the same manner, the refresh address counter (not shown) may output all of the addresses of the memory array sequentially. The refresh timing signal, which is a clock signal having a predetermined cycle, is generated by the refresh address generator 212 and input to the refresh address counter.

Referring to FIG. 2, the address comparator 213 receives the skip address SKIP_ADDR from the skip address storage unit 211 and receives the refresh address REF_ADDR from the refresh address generator 212. The address comparator 213 compares the skip address SKIP_ADDR received from the skip address storage unit 211 with the refresh address REF_ADDR received from the refresh address generator 212 in order to determine whether the memory array corresponding to the refresh address REF_ADDR generated by the refresh address generator 212 is required to be refreshed or not. The address comparator 213 activates or deactivates the refresh control signal REF_CON based on the comparison result and outputs the activated or deactivated refresh control REF_CON to the memory circuit 220. The activation or deactivation of the output signal based on the comparison between two addresses is well known by those of ordinary skill in the art, and therefore detailed descriptions thereof will be omitted here. For example, a method of determining whether two addresses are the same or not using a plurality of XOR gates that output a logic high signal when two input signals are the same and output a logic low signal when two input signals are different is well known in the art.

The address comparator 213 deactivates the refresh control signal REF_CON when the refresh address REF_ADDR corresponds to an excluded region in the memory array as a result of the comparison between the skip address SKIP_ADDR and the refresh address REF_ADDR, and outputs the deactivated refresh control signal REF_CON to the memory circuit 220.

On the other hand, the address comparator 213 activates the refresh control signal REF_CON when the refresh address REF_ADDR corresponds to an "included region" requiring self refresh in the memory array as a result of the comparison between the skip address SKIP_ADDR and the refresh address REF_ADDR, and outputs the activated refresh control signal REF_CON to the memory circuit 220. If the activated refresh control signal REF_CON is output to the memory circuit 220, the address comparator 213 may output the refresh address REF_ADDR received from the refresh address generator 212 to the memory circuit 220. Meanwhile, as described above, the refresh address REF_ADDR may be directly input from the refresh address generator 212 to the memory circuit 220.

Meanwhile, as described above, the skip address storage unit 211 may store the first address of the excluded region and an address subsequent to the last address of the excluded region of the memory array (not shown) as a skip address SKIP_ADDR. In this regard, the address comparator 213 compares the skip address SKIP_ADDR and the refresh address REF_ADDR. If the skip address SKIP_ADDR is identical to the refresh address REF_ADDR, the address comparator 213 toggles the refresh control signal REF_CON and outputs the toggled signal.

This will now be described in some additional detail.

For example, it is assumed that the memory array of the memory circuit 220 has row addresses from '000' to '111', and excluded regions having row addresses of '001', '010', and '011' are not required to be self-refreshed. Since the skip address storage unit 211 may store the first address of an excluded region and an address subsequent to the last address of the excluded region as a skip address SKIP_ADDR, the skip address storage unit 211 stores '001' as the first address of the excluded region and '100' as the subsequent address to '011', which is the last address of the excluded region, as a skip address SKIP_ADDR.

If a self refresh-start command signal is input to the refresh address generator 212, the refresh address generator 212 generates '000' that is the first row address of the memory array as the refresh address REF_ADDR and outputs the refresh address REF_ADDR to the address comparator 213 in the first refresh cycle. The address comparator 213 activates the refresh control signal REF_CON and outputs the activated signal since there is no skip address SKIP_ADDR that is identical to the refresh address REF_ADDR. Here, the initial state of the refresh control REF_CON may be an activated one. The memory circuit 220 may refresh the region of the memory array having a row address of '000' according to the input refresh address REF_ADDR in response to the activated refresh control signal REF_CON.

Then, in the second refresh cycle, the refresh address generator 212 sequentially increases the refresh address REF_ADDR and outputs '001' as the refresh address REF_ADDR to the address comparator 213. Since the refresh address REF_ADDR '001' is identical to the skip address SKIP_ADDR '001', the address comparator 213 deactivates the refresh control signal REF_CON by toggling the refresh control signal REF_CON and outputs the deactivated signal. Thus, the memory circuit 220 does not perform a refresh operation in response to the deactivated refresh control signal REF_CON.

Then, in the third refresh cycle, the refresh address generator 212 sequentially increases the refresh address REF_ADDR and outputs '010' as the refresh address REF_ADDR to the address comparator 213. Since there is no skip address SKIP_ADDR that is identical the refresh address REF_ADDR '010', the address comparator 213 deactivates the refresh control signal REF_CON without toggling the refresh control signal REF_CON and outputs the deactivated refresh control signal REF_CON. Thus, the memory circuit 220 does not perform a refresh operation.

Then, in the fourth refresh cycle, the refresh address generator 212 sequentially increases the refresh address REF_ADDR and outputs '011' as the refresh address REF_ADDR to the address comparator 213. Since there is no skip address SKIP_ADDR that is identical to the refresh address REF_ADDR '011', the address comparator 213 deactivates the refresh control signal REF_CON without toggling the refresh control signal REF_CON and outputs the deactivated refresh control signal REF_CON. Thus, the memory circuit 220 does not perform a refresh operation.

Then, in the fifth refresh cycle, the refresh address generator 212 sequentially increases the refresh address REF_ADDR and outputs '100' as the refresh address REF_ADDR to the address comparator 213. Since the refresh address REF_ADDR '100' is identical to the skip address SKIP_ADDR '100', the address comparator 213 activates the refresh control signal REF_CON by toggling the refresh control signal REF_CON and outputs the activated refresh control signal REF_CON. Thus, the memory circuit 220 may refresh the region of the memory array having a row address of '100' according to the refresh address REF_ADDR.

Since the sequentially increasing refresh address REF_ADDR is not always continuously identical to the skip address SKIP_ADDR in the following row addresses, the refresh control signal REF_CON is in the activated state, and regions having a row address up to '111' in the memory array may be refreshed.

After the external self refresh-start command signal is applied to the refresh address generator 212 and until a self refresh-stop command signal is later applied, the self refresh operation is repeated for a self refresh period. If the command signal CMD input to the refresh address generator 212 is the self refresh-stop command signal, a self refresh counter (not shown) of the refresh address generator 212 does not output the refresh address REF_ADDR any more. Accordingly, the address comparator 213 outputs the deactivated refresh control signal REF_CON to the memory circuit 220 to terminate the self refresh operation.

Meanwhile, the skip address storage unit 211 may store the first and last addresses of the excluded region in the memory array (not shown) of the memory circuit 220 as a skip address SKIP_ADDR. In this regard, if the first address of the excluded region is identical to the refresh address REF_ADDR, the refresh control signal REF_CON is toggled in the refresh cycle. If the last address of the excluded region is identical to the refresh address REF_ADDR, the refresh control signal REF_CON is toggled in the subsequent refresh cycle. This is because the self refresh operation is started again from the address subsequent to the last address of the excluded region. The configuration and operation of the address comparator 213 may vary according to the skip address SKIP_ADDR stored in the skip address storage unit 211 as is well understood by those of skilled in the art, and therefore a detailed descriptions thereof will be omitted here.

Figure 3:
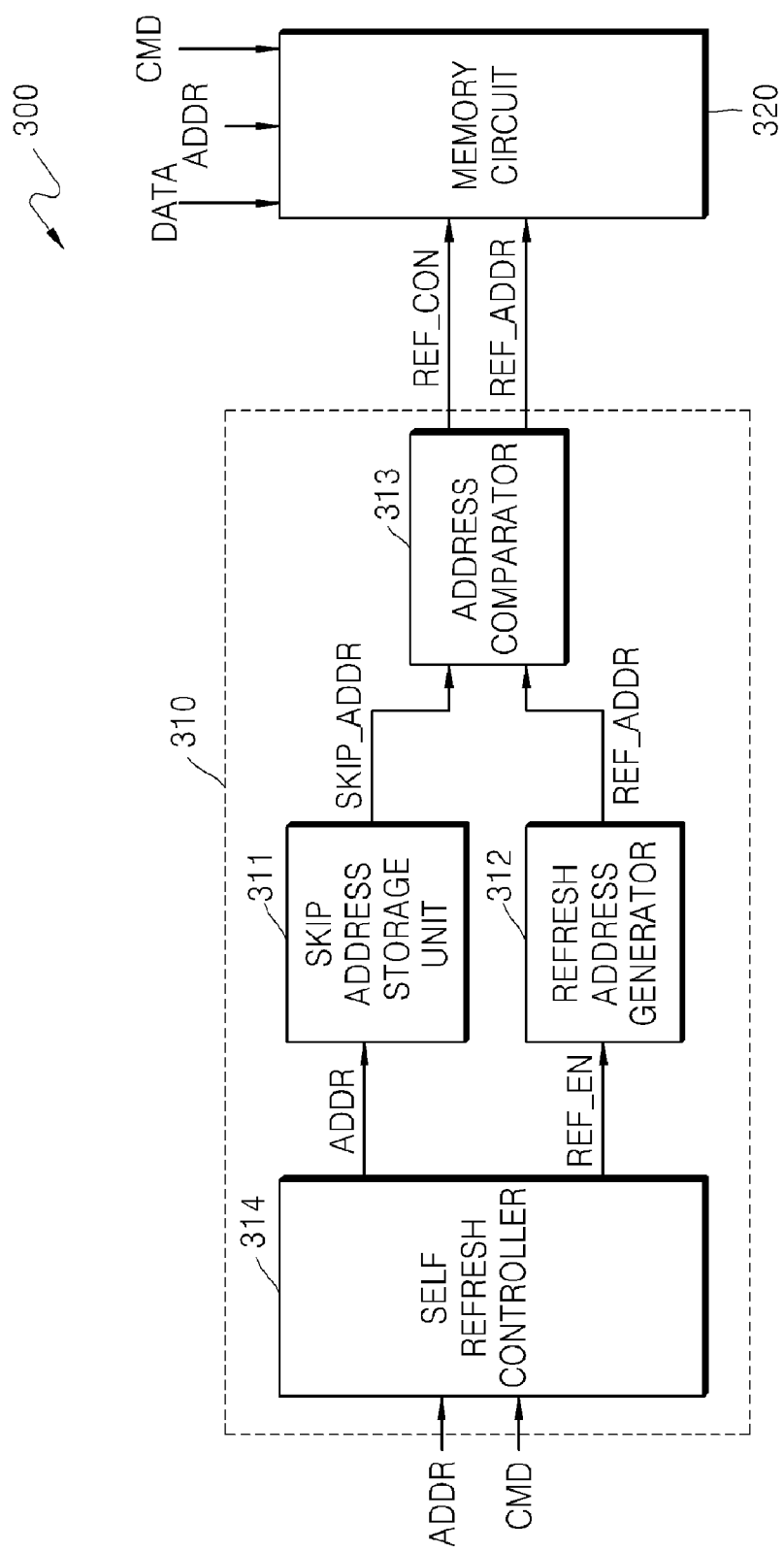
FIG. 3 is a block diagram of a semiconductor memory device according to another embodiment of the inventive concept.

FIG. 3 is a block diagram of a semiconductor memory device 300 according to another embodiment of the inventive concept. Referring to FIG. 3, the semiconductor memory device 300 includes a self refresh circuit 310 and a memory circuit 320. The memory circuit 320 may have a similar configuration and operation to the memory circuit 120 of FIG. 1. The self refresh circuit 310 of FIG. 3 may be an example of the self refresh circuit 110 of FIG. 1.

As shown in FIG. 3, the self refresh circuit 310 may include a skip address storage unit 311, a refresh address generator 312, an address comparator 313, and a self refresh controller 314.

The self refresh controller 314 receives a command signal CMD and address signal ADDR. If the received command signal CMD is a mode register write signal, the self refresh controller 314 may output the received address signal ADDR to the skip address storage unit 311. If the received command signal CMD is a self refresh-start command signal, the self refresh controller 314 activates a refresh enable signal REF_EN and outputs the activated refresh enable signal REF_EN to the refresh address generator 312.

The skip address storage unit 311 may receive an address signal ADDR from the self refresh controller 314 and store the received address ADDR as a skip address SKIP_ADDR. The skip address storage unit 311 of FIG. 3 may be similar to the skip address storage unit 211 of FIG. 2. That is, as described with reference to FIG. 2, the skip address storage unit 311 may store the first and last addresses of the excluded region in the memory array (not shown) of the memory circuit 320 as the skip address SKIP_ADDR. In addition, according to another embodiment, the skip address storage unit 311 may store the first address of the excluded region and an address subsequent to the last address of the excluded region, i.e., the first address of a subsequent region requiring self refresh, as the skip address SKIP_ADDR.

The refresh address generator 312 receives the refresh enable signal REF_EN from the self refresh controller 314 and outputs an address of the memory array to be refreshed to the address comparator 313 as the refresh address REF_ADDR in response to the activation of the refresh enable signal REF_EN. The refresh address REF_ADDR is an address of the memory array to be refreshed and may be a row address of the memory array. Meanwhile, the refresh address generator 312 may output the refresh address REF_ADDR directly to memory circuit 320 in addition to the address comparator 313.

The refresh address generator 312 may include a refresh address counter (not shown). The refresh address counter (not shown) may sequentially increase the refresh address REF_ADDR according to a refresh timing signal and output the refresh address REF_ADDR. For example, if the activated refresh enable signal REF_EN is input to the refresh address generator 312, the refresh address counter (not shown) may output a first refresh address in a first cycle of the refresh timing signal and a subsequent address of the first refresh address as a second refresh address in a second cycle of the refreshing timing signal. In the same manner, the refresh address counter (not shown) may output all of the addresses of the memory array sequentially.

Referring to FIG. 3, the self refresh circuit 313 receives a skip address SKIP_ADDR and a refresh address REF_ADDR, compares the skip address SKIP_ADDR with the refresh address REF_ADDR, and outputs a refresh control signal REF_CON based on the comparison result. In other words, the address comparator 313 compares the skip address SKIP_ADDR stored in the skip address storage unit 311 with the refresh address REF_ADDR in order to determine whether the memory array corresponding to the refresh address REF_ADDR generated by the refresh address generator 312 is required to be refreshed or not. The address comparator 313 activates or deactivates the refresh control signal REF_CON based on the comparison result and outputs the activated or deactivated refresh control REF_CON to the memory circuit 320. The address comparator 313 of FIG. 3 has a similar configuration and operation to the address comparator 213 of FIG. 2, and therefore detailed descriptions thereof will be omitted here.

The memory circuit 320 receives the refresh control signal REF_CON and the refresh address REF_ADDR and refreshes a memory region corresponding to the refresh address REF_ADDR in response to the activation of the refresh control signal REF_CON. The memory circuit 320 of FIG. 3 has a similar configuration and operation to the memory circuit 120 of FIG. 1 and memory circuit 220 of FIG. 2, and therefore detailed descriptions thereof will be omitted here.

Figure 4:
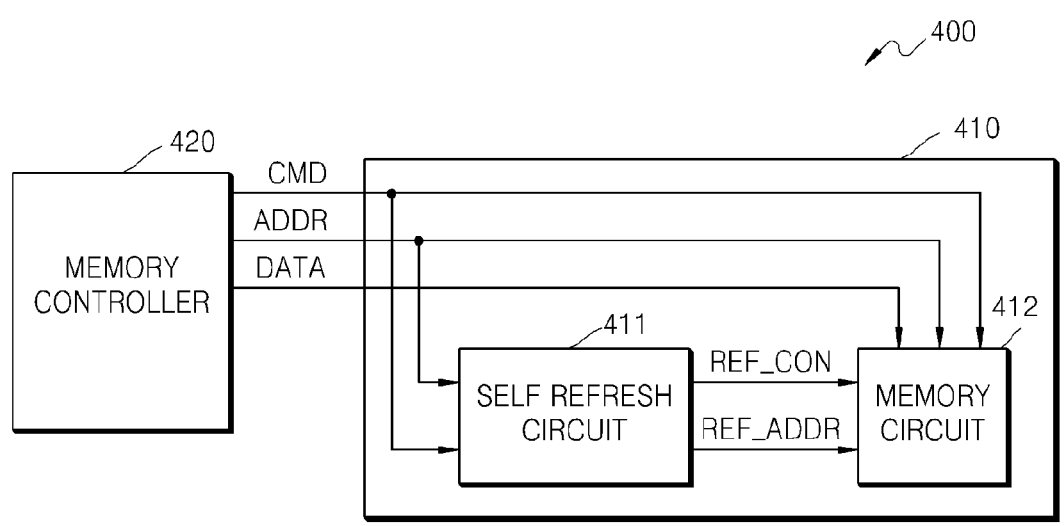
FIG. 4 is a block diagram of a semiconductor memory system according to an embodiment of the inventive concept.

FIG. 4 is a block diagram of a semiconductor memory system 400 according to an embodiment of the inventive concept. Referring to FIG. 4, the semiconductor memory system 400 includes a semiconductor memory device 410 and a memory controller 420. The semiconductor memory device 410 has a similar configuration and operation to the semiconductor memory devices 100, 200, and 300 of FIGS. 1 to 3, and therefore detailed descriptions thereof will be omitted here.

The memory controller 420 of FIG. 4 may output a command signal CMD, an address signal ADDR, and a data signal DATA to the semiconductor memory device 410. If there is a excluded region in a memory array (not shown) of a memory circuit 412, the memory controller 420 outputs a mode register write signal to the self refresh circuit 411 as a command signal CMD and outputs the first and last addresses of the excluded region to the self refresh circuit 411 as an address signal ADDR. As described with reference to FIGS. 2 and 3, the self refresh circuit 411 may store a skip address SKIP_ADDR in the skip address storage units 211 and 311 according to the command signal CMD and the address signal ADDR.

Meanwhile, the memory controller 420 may output a mode register write signal to the self refresh circuit 411 as the command signal CMD and output the first address of the excluded region and an address subsequent to the last address of the excluded region, i.e., the first address of a subsequent region requiring self refresh to the self refresh circuit 411 as the skip address SKIP_ADDR.

The memory controller 420 may output the self refresh-start command signal to the self refresh circuit 411 as the command signal CMD if the memory circuit 412 is required to be self-refreshed. As described with reference to FIGS. 2 and 3, the self refresh circuit 411 may generate the refresh address REF_ADDR in the refresh address generators 212 and 312 and output the refresh address REF_ADDR in response to the self refresh-start command signal.

The operations of the self refresh circuit 411 and the memory circuit 412 according to the command signal CMD, the address signal ADDR, and the data signal DATA received from the memory controller 420 are described with reference FIGS. 2 and 3, and therefore detailed descriptions thereof will be omitted here.

Figure 5:
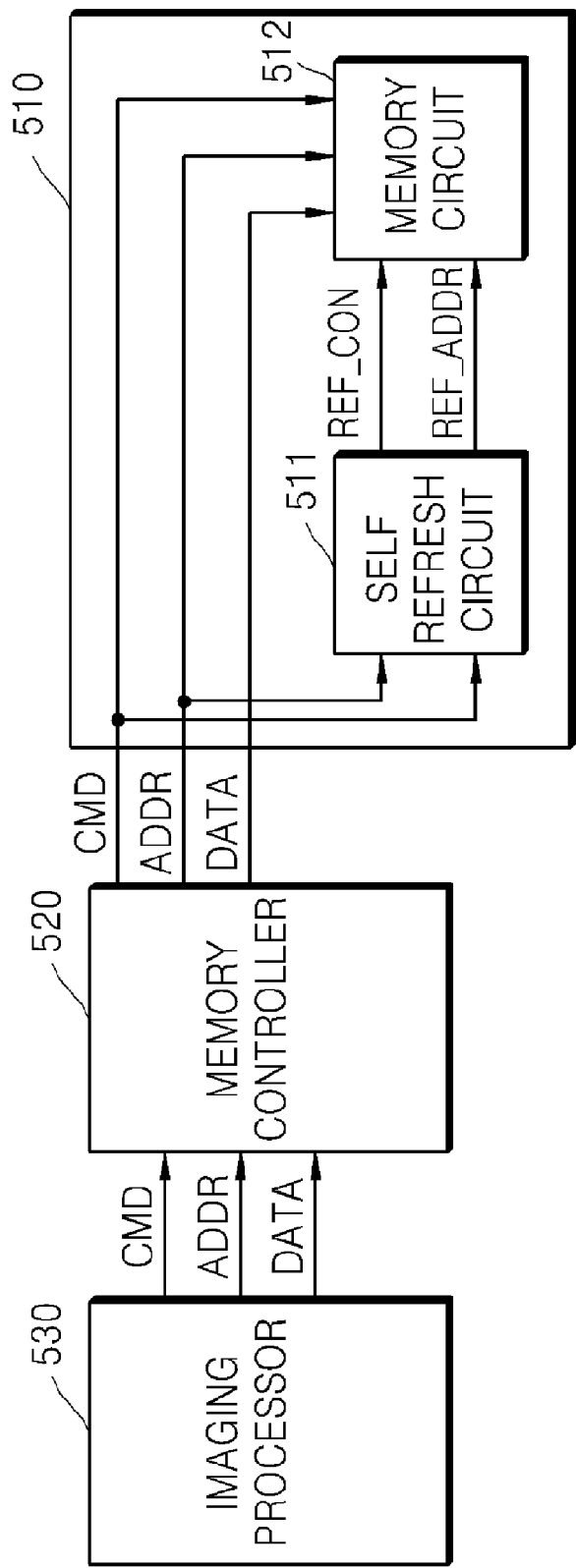
FIG. 5 is a block diagram of a semiconductor memory system according to another embodiment of the inventive concept.

FIG. 5 is a block diagram of a semiconductor memory system 500 according to an embodiment of the inventive concept. Referring to FIG. 5, the semiconductor memory system 500 comprises a semiconductor memory device 510, a memory controller 520, and an imaging processor 530. The semiconductor memory device 510 and the memory controller 520 may have a similar configuration and operation to the semiconductor memory device 410 and the memory controller 420 of FIG. 4.

The imaging processor 530 is a device capable of encoding/decoding an image signal in accordance with the control of an operating system. In one possible embodiment, the imaging processor 530 may be a H.264 processor or another digital signal processor (DSP). The imaging processor 530 may temporarily store data to be processed while encoding/decoding the image signal. Thus, the data being processed by the imaging processor 530 in the semiconductor memory device 510 is data that does not require self refresh.

Thus, if data processing is requested by the imaging processor 530, the memory controller 520 may set (or define by corresponding address) a memory region storing the image data being processed to be an excluded region. Accordingly, the memory controller 520 may output the mode register write signal to the self refresh circuit 511 as the command signal CMD and output the address of the excluded region to the self refresh circuit 511. As described with reference to FIGS. 2 and 3, the self refresh circuit 511 may store the address as a skip address SKIP_ADDR.

Figure 6:
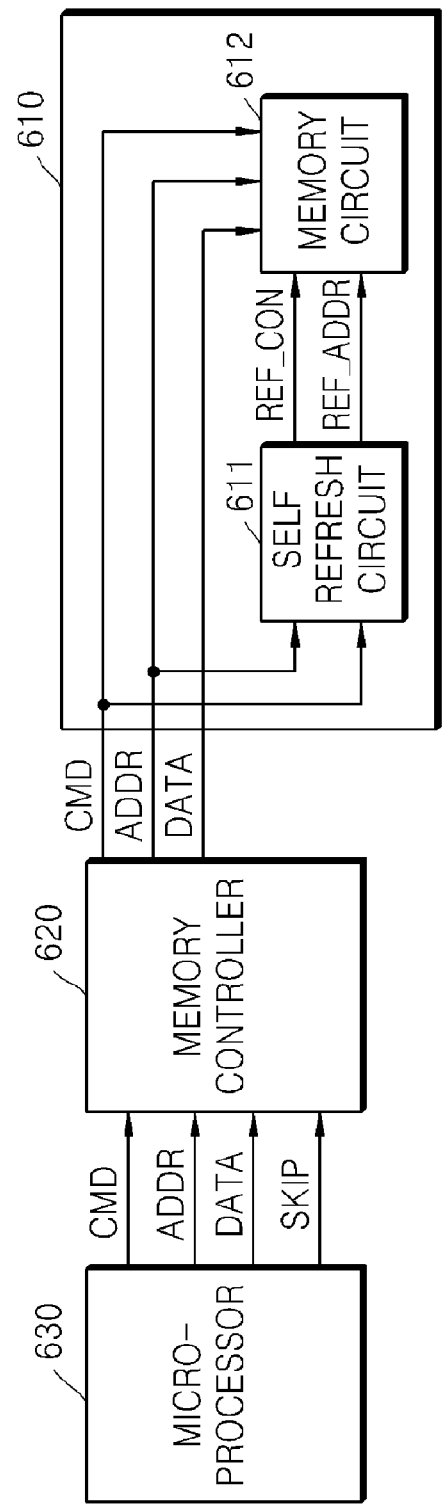
FIG. 6 is a block diagram of a semiconductor memory system according to another embodiment of the inventive concept.

FIG. 6 is a block diagram of a semiconductor memory system according to another embodiment of the inventive concept. Referring to FIG. 6, the semiconductor memory system 600 comprises a semiconductor memory device 610, a memory controller 620, and a microprocessor 630. The semiconductor memory device 610 and the memory controller 620 may have a similar configuration and operation to the semiconductor memory device 410 and the memory controller 420 of FIG. 4.

In certain embodiments of the inventive concept, the microprocessor 630 may be a universal microprocessor and may request the memory controller 620 to read data from or write data to the memory under the control of the operating system.

The data being processed by the microprocessor 630 in the semiconductor memory device 610 may be data stored in the semiconductor memory device 610 for such a duration that self-refresh is required, or it may be data temporarily stored in the semiconductor memory device 610 that does not require self-refresh. Accordingly, the microprocessor 630 may generate a skip signal SKIP and output the skip signal SKIP to the memory controller 620. That is, the memory controller 620 may determine that the data (DATA) received from the microprocessor 630 is data not requiring self refresh if the skip signal SKIP is activated, and may alternately determine that data (DATA) received from the microprocessor 630 is data requiring self refresh if the skip signal SKIP is deactivated.

If the activated skip signal SKIP is applied, the memory controller 620 sets the memory region storing the data being processed to an excluded region since the data (DATA) received from the microprocessor 630 does not require self refresh. Accordingly, the memory controller 620 may output the mode register write signal to the self refresh circuit 611 as the command signal CMD and output the address of the excluded region to the self refresh circuit 611. As described with reference to FIGS. 2 and 3, the self refresh circuit 611 may store the address as a skip address SKIP_ADDR.

FIG. 7A conceptually illustrates a conventional partial self refresh operation. Referring to FIG. 7A, the conventional partial self refresh operation is performed for each bank or array and cannot be applied to an operating system controlling a memory. The conventional partial self refresh operation may be performed with respect to a first bank Bank1, a third bank Bank3, and a fourth bank Bank4. First through third arrays array1, array2, and array3 of each bank may be self-refreshed. In FIG. 7A, dark portions indicate memory regions in which self refresh is performed, and light portions indicate regions in which self refresh is not performed.

FIG. 7B shows a partial self refresh operation according to an embodiment of the inventive concept. Referring to FIG. 7B, dark portions indicate memory regions in which self refresh is performed, and light portions indicate regions in which self refresh is not performed. Distinguished from the conventional partial self refresh operation, the partial self refresh operation according to the present embodiment is performed for each address unit of a memory.

Figure 8:
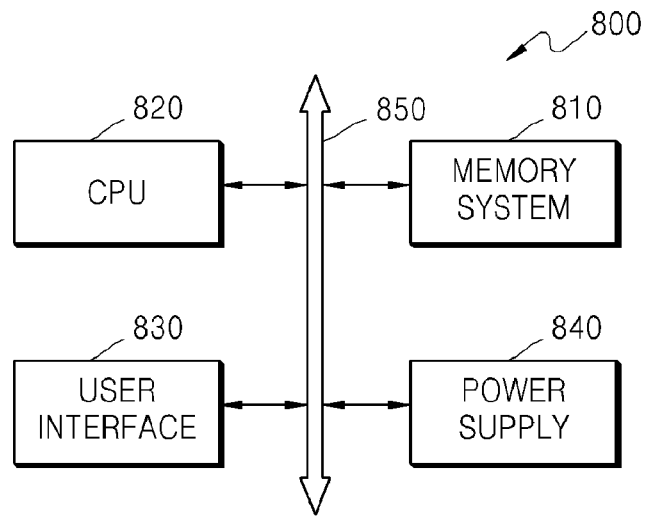
FIG. 8 is a block diagram of a computing system including a semiconductor memory system, according to an embodiment of the inventive concept.

FIG. 8 is a block diagram of a computing system 800 including a semiconductor memory system, according to an embodiment of the inventive concept. Referring to FIG. 8, the computing system 800 comprises a semiconductor memory system 810, a microprocessor 820 electrically connected to a bus 850, a user interface 830, and a power supply device 840.

The semiconductor memory system 810 is described with reference to FIGS. 1 through 5, and detailed descriptions thereof will be omitted here. The configuration and operation of the microprocessor 820, the user interface 830, and the power supply device 840 are well known by those of ordinary skill in the art, and therefore detailed descriptions thereof will be omitted here. The microprocessor 820 may be the imaging processor 530 of FIG. 5 or the microprocessor 630 of FIG. 6. If the computing system 800 is a mobile device, a battery to supply an operating voltage of the computing system 800 may further be included.

Figure 9:
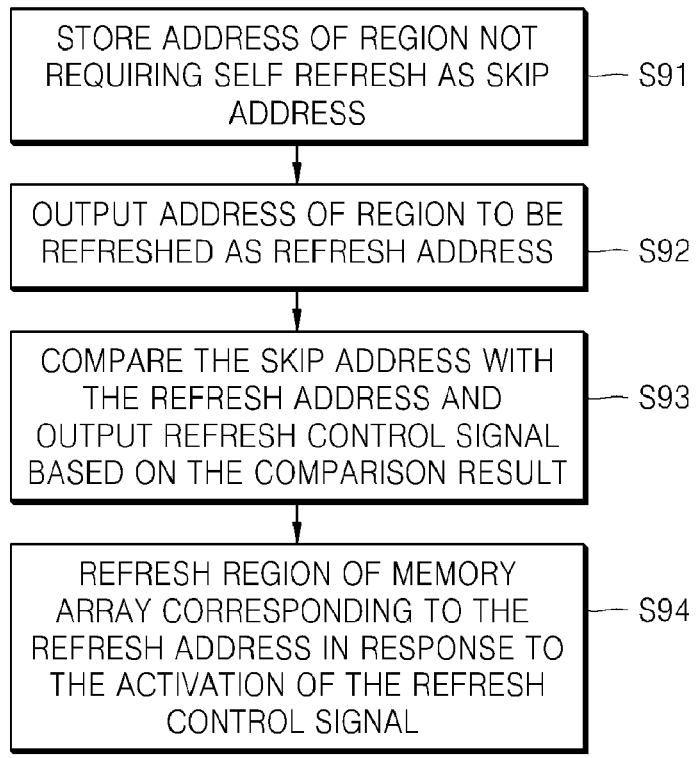
FIG. 9 is a flowchart illustrating a method of performing self refresh of a semiconductor memory device, according to an embodiment of the inventive concept.

FIG. 9 is a flowchart illustrating a method of performing self refresh of a semiconductor memory device, according to an embodiment of the inventive concept. The method of performing self refresh may include: storing an address of a excluded region as a skip address (S91), outputting (or providing) an address of a region to be refreshed as a refresh address (S92), comparing the skip address with the refresh address and outputting a refresh control signal based on the comparison result (S93), and refreshing the region of the memory array corresponding to the refresh address in response to the activation of the refresh control signal (S94).

In addition, the method may further include receiving an external command signal and address signal. In addition, the storing of an address of a excluded region as a skip address (S91) may include storing the address signal as the skip address if the command signal is a mode register write signal. Furthermore, the provision of an address of a region to be refreshed as a refresh address (S92) may include activating a refresh enable signal if the command signal is a self refresh-start command signal, and providing the refresh address in response to the activation of the refresh enable signal. Descriptions of the method of performing the self refresh of the semiconductor memory device according to the present embodiment are similar to those of the semiconductor memory device with reference to FIGS. 1 through 3, and therefore detailed descriptions thereof will be omitted here.

Of further note, the semiconductor memory device, semiconductor memory module, and semiconductor memory system according to the present inventive concept may be mounted using various packages. For example, the semiconductor memory device, semiconductor memory module, and semiconductor memory system according to the present inventive concept may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), thin quad flat pack (TQFP), system in package (SIP), multi chip package (MCP), wafer-level fabricated package (WFP), and wafer-level processed stack package (WSP).

While the inventive concept has been particularly shown and described with reference to exemplary embodiments thereof, it will be understood that various changes in form and details may be made therein without departing from the scope of the following claims.

What is claimed is:

1. A semiconductor memory device comprising:
a memory circuit comprising a memory array;
a skip address storage unit configured to store an address of an excluded region of the memory array not requiring refresh as a skip address;
a refresh address generator configured to provide an address of a region of the memory array requiring refresh as a refresh address; and
an address comparator configured to receive and compare the skip address and the refresh address, and provide an activated or deactivated refresh control signal to the memory circuit in response to the comparison of the skip address and refresh address,
wherein the semiconductor memory device receives a command signal and an address signal, and
wherein the skip address storage unit stores the address signal as a skip address if the command signal is a mode register write signal.

2. The semiconductor memory device of claim 1, wherein the memory circuit is configured to receive the refresh control signal and the refresh address, and refresh the region of the memory array corresponding to the refresh address in response to the activated refresh control signal.

3. The semiconductor memory device of claim 1, wherein the skip address storage unit is further configured to receive the command signal and the address signal.

4. The semiconductor memory device of claim 1, wherein the address comparator is further configured to deactivate the refresh control signal if the refresh address corresponds to the excluded region in the memory array based on the comparison of the skip address and refresh address, or activate the refresh control signal if the refresh address corresponds to the region requiring refresh in the memory array based on the comparison of the skip address and refresh address.

5. The semiconductor memory device of claim 1, further comprising:
a self refresh controller configured to receive the command signal and the address signal, and provide the address signal to the skip address storage unit if the command signal is a mode register write signal, activate a refresh enable signal and provide the activated refresh enable signal to the refresh address generator if the command signal is a self refresh-start command signal, and
the refresh address generator is further configured to provide an address of the region in the memory array requiring refresh as the refresh address in response to activation of the refresh enable signal received from the self refresh controller.

6. The semiconductor memory device of claim 1, wherein the skip address storage unit stores a first and a second skip addresses of the excluded region, and
wherein the address comparator is further configured to toggle the refresh control signal if the first or second skip address is identical to the refresh address.

7. The semiconductor memory device of claim 6, wherein the first and second skip addresses are the first and last addresses of the excluded region respectively.

8. The semiconductor memory device of claim 6,
wherein the first skip address is the first address of the excluded region, and
wherein the second skip address is an address subsequent to the last address of the excluded region.

9. A semiconductor memory system comprising:
a semiconductor memory device; and
a memory controller configured to control the semiconductor memory device by providing at least a command signal, an address signal, and a data signal to the semiconductor memory device,
wherein the semiconductor memory device comprises:
a memory circuit comprising a memory array;
a skip address storage unit configured to store an address of an excluded region of the memory array not requiring refresh as a skip address;
a refresh address generator configured to provide an address of a region of the memory array requiring refresh as a refresh address; and
an address comparator configured to receive and compare the skip address and the refresh address, and provide an activated or deactivated refresh control signal to the memory circuit in response to the comparison of the skip address and refresh address,
wherein the memory controller is further configured to provide an address signal to be stored in the skip storage unit as a skip address if the command signal is a mode register write signal.

10. The semiconductor memory system of claim 9, further comprising:
an imaging processor configured to provide temporary data related to the encoding/decoding of an image signal to the memory controller,
wherein the memory controller is further configured to provide a mode register write command signal as the command signal, and an address of a region of the memory array in which the temporary data is stored as the address signal when the temporary data is provided from the imaging processor.

11. The semiconductor memory system of claim 9, further comprising:
a microprocessor configured to request that the memory controller read data from or write data to the semiconductor memory device, generate a skip signal based on whether the data provided to the memory controller requires refresh, and provide the skip signal to the memory controller,
wherein the memory controller is further configured to provide the mode register write command signal as the command signal and provide the address of a region in the memory array in which data received from the microprocessor is stored as the address signal in response to activation of the skip signal.

12. A method of performing self refresh of a semiconductor memory device, the method comprising:
storing an address of an excluded region in a memory array not requiring refresh as a skip address;
providing an address of a region in the memory array requiring refresh as a refresh address;
comparing the skip address to the refresh address, and providing a refresh control signal based on a result of the comparison;
refreshing the region of the memory array corresponding to the refresh address in response to activation of the refresh control signal; and
receiving a command signal and address signal,
wherein the storing the address of the excluded region as the skip address comprises storing the address signal as the skip address if the command signal is a mode register write signal, and
the providing the address of the region to be refreshed as the refresh address comprises activating a refresh enable signal if the command signal is a self refresh-start command signal; and
providing the refresh address in response to activation of the refresh enable signal.

13. The method of claim 12, further comprising:
receiving temporary data from an imaging processor related to encoding/decoding of an image signal;
providing a mode register write command signal as the command signal, and an address of a region of the memory array in which the temporary data is stored as the address signal.

14. The method of claim 12, further comprising:
receiving a request to write data to the semiconductor memory device;
generating the skip signal based on whether the data to be written requires refresh;
providing the mode register write command signal as the command signal and the address of a region in the memory array to which the data is to be written as the address signal response to activation of the skip signal.

* * * * *